United States Patent
Saito et al.

(10) Patent No.: US 7,304,331 B2
(45) Date of Patent: *Dec. 4, 2007

(54) NITRIDE SEMICONDUCTOR DEVICE SUCH AS TRANSVERSE POWER FET FOR HIGH FREQUENCY SIGNAL AMPLIFICATION OR POWER CONTROL

(75) Inventors: Wataru Saito, Kanagawa (JP); Ichiro Omura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 273 days.

This patent is subject to a terminal disclaimer.

(21) Appl. No.: 11/014,869

(22) Filed: Dec. 20, 2004

(65) Prior Publication Data

US 2006/0011915 A1    Jan. 19, 2006

(30) Foreign Application Priority Data

Jul. 14, 2004  (JP) ............... 2004-207409

(51) Int. Cl.
  *H01L 31/0328* (2006.01)
  *H01L 31/0336* (2006.01)
  *H01L 31/072* (2006.01)
  *H01L 31/109* (2006.01)

(52) U.S. Cl. ............ 257/192; 257/187; 257/E29.009; 257/E29.116; 257/E29.252

(58) Field of Classification Search ............ 257/192
See application file for complete search history.

(56) References Cited

U.S. PATENT DOCUMENTS 5,302,840 A    4/1994    Takikawa 6,100,549 A    8/2000    Weitzel et al.

(Continued)

FOREIGN PATENT DOCUMENTS

JP    05-021793    1/1993

(Continued)

OTHER PUBLICATIONS

Tamotsu Hashizume, et al., "Surface passivation of GaN and GaN/AlGaN heterostructures by dielectric films and its application to insulated-gate heterostructure transistors", J. Vac. Sci. Technol. B, vol. 21, No. 4, Jul./Aug. 2003, pp. 1828-1838.

(Continued)

*Primary Examiner*—Howard Weiss
(74) *Attorney, Agent, or Firm*—Oblon, Spivak, McClelland, Maier & Neustadt, P.C.

(57) ABSTRACT

A nitride semiconductor device according to one embodiment of the present invention includes: a non-doped first aluminum gallium nitride ($Al_xGa_{1-x}N$ ($0 \leq x \leq 1$)) layer which is formed as a channel layer; a non-doped or n type second aluminum gallium nitride ($Al_yGa_{1-y}N$ ($0 \leq y \leq 1$, x <y)) layer which is formed on the first aluminum gallium nitride layer as a barrier layer; an aluminum nitride (AlN) film which is formed on the second aluminum gallium nitride layer as a gate insulating film lower layer; an aluminum oxide ($AL_2O_3$) film which is formed on the aluminum nitride film as a gate insulating film upper layer; a source electrode and a drain electrode which are formed as first and second main electrodes to be electrically connected to the second aluminum gallium nitride layer, respectively; and a gate electrode which is formed on the aluminum oxide film as a control electrode.

16 Claims, 11 Drawing Sheets

U.S. PATENT DOCUMENTS

| | | | |
|---|---|---|---|
| 6,100,571 | A | 8/2000 | Mizuta et al. |
| 6,555,851 | B2 | 4/2003 | Morizuka |
| 6,737,683 | B2 * | 5/2004 | Inoue et al. ............... 257/192 |
| 6,831,339 | B2 * | 12/2004 | Bojarczuk et al. ......... 257/411 |
| 6,933,544 | B2 * | 8/2005 | Saito et al. ................ 257/194 |
| 2003/0151101 | A1 | 8/2003 | Rumennik et al. |
| 2005/0274977 | A1 * | 12/2005 | Saito et al. ................ 257/192 |

FOREIGN PATENT DOCUMENTS

| | | |
|---|---|---|
| JP | 11-261053 | 9/1999 |
| JP | 2000-252458 | 9/2000 |
| JP | 2000-315804 | 11/2000 |
| JP | 2001-230263 | 8/2001 |
| JP | 3271613 | 1/2002 |
| JP | 2002-299625 | 10/2002 |
| JP | 2003-017409 | 1/2003 |

OTHER PUBLICATIONS

Narihiko Maeda, et al., "Doping design of GaN-based heterostructure field-effect transistors with high electron density for high-power applications", Phys. Stat. Sol. (a) 200, No. 1, 2003, pp. 168-174.

U.S. Appl. No. 11/739,874, filed Apr. 25, 2007, Saito et al.
U.S. Appl. No. 11/014,869, filed Dec. 20, 2004, Saito et al.

* cited by examiner

NITRIDE SEMICONDUCTOR DEVICE SUCH AS TRANSVERSE POWER FET FOR HIGH FREQUENCY SIGNAL AMPLIFICATION OR POWER CONTROL

CROSS REFERENCE TO RELATED APPLICATION

The subject application is related to subject matter disclosed in Japanese Patent Application No. 2004-207409 filed on Jul. 14, 2004 in Japan to which the subject application claims priority under Paris Convention and which is incorporated herein by reference.

BACKGROUND OF THE INVENTION

1. Field of the Invention

The present invention relates to a nitride semiconductor device, and in particular to a transverse power FET which is used for high frequency signal amplification, power control or the like.

2. Related Background Art

Since an electronic device including a aluminum gallium nitride/gallium nitride (AlGaN/GaN) heterostructure has a critical electric field higher than that in a conventional electronic device which includes gallium arsenide (GaAs) or silicon (Si) as main material and is used for high frequency signal amplification or power control, it allows realization of a high breakdown voltage and high output device.

In a field effect transistor (HFET) including a aluminum gallium nitride/gallium nitride (AlGaN/GaN) heterostructure, leakage current is large at a Schottky gate, but it is effective for suppressing leakage current to use an insulating gate structure.

The insulating gate structure requires a gate insulating film which has an excellent breakdown voltage and does not generate a large amount of energy level in an interface with a aluminum gallium nitride (AlGaN) layer. In particular, when aluminum oxide ($Al_2O_3$) film is used as the gate insulating film, it is expected to achieve an excellent insulating gate structure which has a small leakage current regardless of a positive value or a negative value of a gate voltage in view of the magnitude of a band discontinuity amount.

A MIS-HFET which includes a aluminum gallium nitride/gallium nitride (AlGaN/GaN) heterostructure and using aluminum oxide ($Al_2O_3$) film or an aluminum oxide/silicon nitride ($Al_2O_3$/SiN) stacked film as a gate insulating film has been reported.

Besides, a MIS-HFET which uses a silicon oxide ($SiO_2$) film as a gate insulating film and has an aluminum nitride (AlN) film formed between a aluminum gallium nitride/gallium nitride (AlGaN/GaN) heterostructure and a gate insulating silicon oxide ($SiO_2$) film has been proposed and known. For example, refer to Japanese Patent Laid-Open Publication No. 2000-252458. In the Japanese Patent Laid-Open Publication No. 2000-252458, an aluminum nitride (AlN) film is described as a portion of a gate insulating film. In a semiconductor device described in the Publication, however, since a source electrode and a drain electrode come in contact with only the aluminum nitride (AlN) film, in fact, the aluminum nitride (AlN) film functions as a semiconductor layer but not as a portion of the gate insulating film. Therefore, it is considered that the aluminum nitride (AlN) film described in the Publication is usually formed as a single crystal film.

The aluminum oxide ($Al_2O_3$) is promising as the gate insulating film. In a combination of the alumimum oxide ($Al_2O_3$) with the aluminum gallium nitride/gallium nitride (AlGaN/GaN) heterostructure, however, it is difficult to achieve an excellent interface between the gate insulating film and the semiconductor layer. That is, when the aluminum gallium nitride (AlGaN) layer is oxidized during formation of the aluminum oxide ($Al_2O_3$), an interface state is considerably increased.

On the other hand, increase in interface state is suppressed by forming a silicon nitride (SiN) film between the aluminum gallium nitride (AlGaN) layer and the aluminum oxide ($Al_2O_3$) film as an anti-oxidizing film for the aluminum gallium nitride (AlGaN) layer. However, since the silicon nitride (SiN) film is considerably different in thermal expansion coefficient from the aluminum oxide ($Al_2O_3$) film or the aluminum gallium nitride/gallium nitride (AlGaN/GaN) layer positioned above or below, there arises such a problem that a state of an interface between the gate insulating film and the semiconductor layer deteriorates due to thermal treatment process.

SUMMARY OF THE INVENTION

According to one embodiment of the present invention, there is provided a nitride semiconductor device comprising:

a non-doped first aluminum gallium nitride ($Al_xGa_{1-x}N$ ($0 \leq x \leq 1$)) layer which is formed as a channel layer;

a non-doped or n type second aluminum gallium nitride ($Al_yGa_{1-y}N$ ($0 \leq y \leq 1$, $x<y$)) layer which is formed on the first aluminum gallium nitride layer as a barrier layer;

an aluminum nitride (AlN) film which is formed on the second aluminum gallium nitride layer as a gate insulating film lower layer;

an aluminum oxide ($Al_2O_3$) film which is formed on the aluminum nitride film as a gate insulating film upper layer;

a source electrode and a drain electrode which are formed as first and second main electrodes to be electrically connected to the second aluminum gallium nitride layer, respectively; and a gate electrode which is formed on the aluminum oxide film as a control electrode.

According to another embodiment of the present invention, there is provided a nitride semiconductor device comprising:

a non-doped first aluminum gallium nitride ($Al_xGa_{1-x}N$ ($0 \leq x \leq 1$)) layer which is formed as a channel layer;

a non-doped or n type second aluminum gallium nitride ($Al_yGa_{1-y}N$ ($0 \leq y \leq 1$, $x<y$)) layer which is formed on the first aluminum gallium nitride layer as a barrier layer;

a gate electrode which is formed on a portion of the second aluminum gallium nitride layer as a control electrode;

an aluminum nitride (AlN) film which is formed on the second aluminum gallium nitride layer to cover the gate electrode as an insulating film lower layer;

an aluminum oxide ($Al_2O_3$) film which is formed on the aluminum nitride film as an insulating film upper layer; and a source electrode and a drain electrode which are formed as first and second main electrodes to be electrically connected to the second aluminum gallium nitride layer, respectively.

DETAILED DESCRIPTION OF THE EMBODIMENTS

Figure 1:
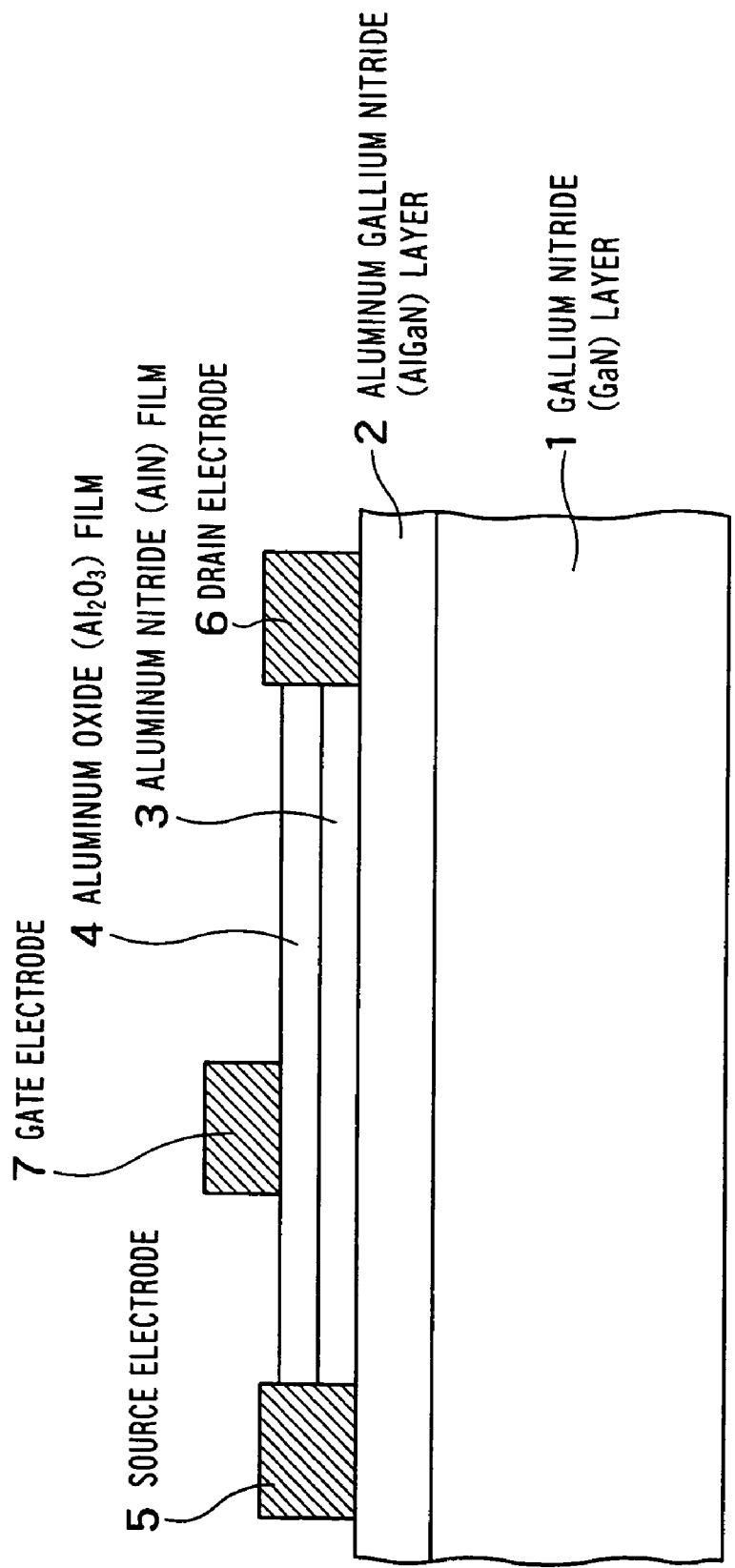
FIG. 1 is a sectional view illustratively showing a structure of a nitride semiconductor device according to a first embodiment of the invention.

Embodiments of a nitride semiconductor device according to the present invention will be explained below with reference to the drawings. Same portions or members in respective drawings are denoted by same reference numerals.

FIG. 1 is a sectional view illustratively showing a structure of a nitride semiconductor device according to a first embodiment of the invention.

A nitride semiconductor device according to the first embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, an aluminum nitride (AlN) film 3 which is formed on the aluminum gallium nitride (AlGaN) layer 2 to serve as a gate insulating film lower layer, an aluminum oxide ($Al_2O_3$) film 4 which is formed on the aluminum nitride (AlN) film 3 to serve as a gate insulating film upper layer, a source electrode 5 and a drain electrode 6 which are respectively formed so as to be electrically connected to the aluminum gallium nitride (AlGaN) layer 2 to serve as first and second main electrodes, and a gate electrode 7 which is formed on the aluminum oxide ($Al_2O_3$) film 4 to serve as a control electrode.

As understood from the above structure, the nitride semiconductor device according to the first embodiment of the invention is an field effect transistor (HFET) which includes a aluminum gallium nitride/gallium nitride (AlGaN/GaN) heterostructure formed from nitrides and has a MIS structure, namely, a MIS-HFET.

The gallium nitride (GaN) layer 1 is formed as a first aluminum gallium nitride ($Al_xGa_{1-x}N$ ($0 \leq x \leq 1$)) layer, and the aluminum gallium nitride (AlGaN) layer 2 is formed as a second aluminum gallium nitride ($Al_yGa_{1-y}N$ ($0 \leq y \leq 1$, $x<y$))) layer.

By forming the aluminum oxide ($Al_2O_3$) film 4 as a gate insulating film, a band discontinuity amount with the aluminum gallium nitride (AlGaN) layer 2 serving as a barrier layer is made large, so that gate leakage current can be suppressed to a small amount.

In the nitride semiconductor device according to the first embodiment of the invention, by forming the aluminum nitride (AlN) film 3 serving as a gate insulating film lower layer to be sandwiched between the aluminum oxide ($Al_2O_3$) film 4 and the aluminum gallium nitride (AlGaN) layer 2, oxidation of the aluminum gallium nitride (AlGaN) layer 2 serving as a barrier layer is suppressed to form an excellent interface between the gate insulating film and the semiconductor layer.

An aluminum nitride (AlN) film is changed to an aluminum oxide ($Al_2O_3$), when it is oxidized. Therefore, in a manufacturing process in the embodiment, a gate insulating film having a two-layers stacked structure of an aluminum oxide ($Al_2O_3$) film 4/an aluminum nitride (AlN) film 3 can be formed easily by first depositing and forming an aluminum nitride (AlN) film using sputtering process or the like and thermally oxidizing an upper layer portion thereof.

On the other hand, the gate insulating film having a two-layers stacked structure of an aluminum oxide ($Al_2O_3$) film 4/an aluminum nitride (AlN) film 3 can be also obtained by depositing and forming an aluminum oxide ($Al_2O_3$) film 4 as well as the aluminum nitride (AlN) film 3 after depositing and forming an aluminum nitride (AlN) film 3 instead of forming an aluminum oxide ($Al_2O_3$) film 4 by oxidizing a portion of an aluminum nitride (AlN) film.

Since the aluminum nitride (AlN) film 3 does not function as a semiconductor layer but as a portion of a gate insulating film, it is preferable for obtaining a flat and fine gate insulating film that the aluminum nitride (AlN) film 3 is formed as polycrystalline or amorphous instead of a single crystalline film.

Thermal expansion coefficients of silicon nitride (SiN), aluminum oxide ($Al_2O_3$), aluminum nitride (AlN) and gallium nitride (GaN) are 2.7, 7.1, 4.5 and 5.4-7.2 (ppm/K), respectively. That is, the thermal expansion coefficient of the aluminum nitride (AlN) is closer to those of the aluminum oxide ($Al_2O_3$) and the gallium nitride (GaN) than that of the silicon nitride (SiN).

Accordingly, by forming the aluminum nitride (AlN) film 3 so as to be sandwiched between the aluminum oxide ($Al_2O_3$) film 4 and the aluminum gallium nitride (AlGaN) layer 2, an insulating gate structure with a high reliability can be realized without generating new interface state even if passing through a thermal treatment process under a high temperature.

As described above, according to the nitride semiconductor device according to the first embodiment of the invention, since the aluminum nitride (AlN) film 3 serving as a gate insulating film lower layer is formed so as to be sandwiched between the aluminum oxide ($Al_2O_3$) film 4 serving as a gate insulating film upper layer and the aluminum gallium nitride (AlGaN) layer 2 serving as a barrier layer, an excellent interface can be formed between the gate insulating film and the semiconductor film by suppressing oxidation of the aluminum gallium nitride (AlGaN) layer 2, and gate leakage current can be suppressed by securing a sufficient band discontinuity amount between the gate insulating film and the barrier layer, so that an insulating gate structure with a high reliability can be realized.

Figure 2:
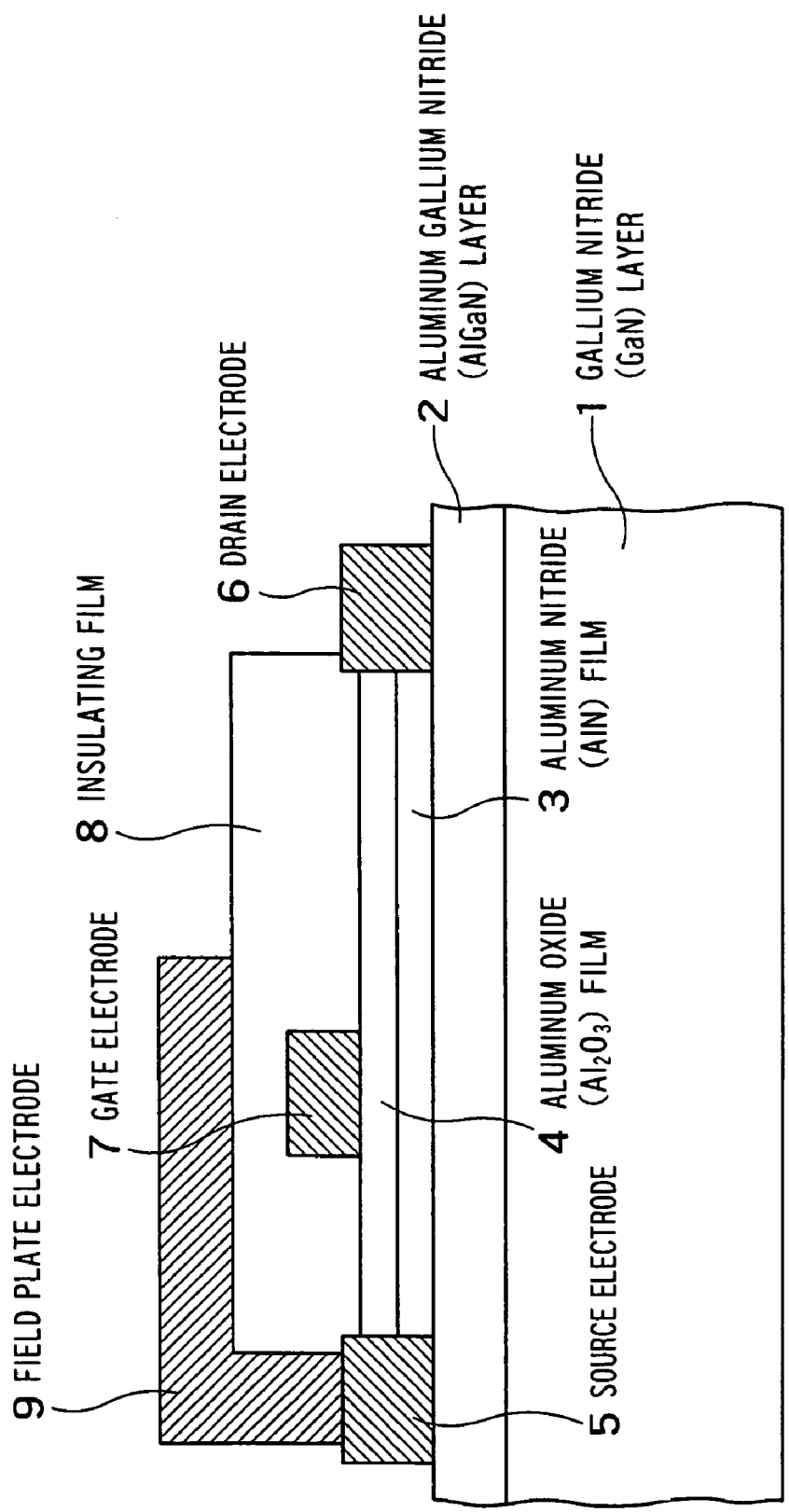
FIG. 2 is a sectional view illustratively showing a structure of a nitride semiconductor device according to a second embodiment of the invention.

FIG. 2 is a sectional view illustratively showing a structure of a nitride semiconductor device according to a second embodiment of the invention.

A nitride semiconductor device according to the second embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, an aluminum nitride (AlN) film 3 which is formed on the aluminum gallium nitride (AlGaN) layer 2 to serve as a gate insulating film lower layer, an aluminum oxide ($Al_2O_3$) film 4 which is formed on the aluminum nitride (AlN) film 3 to serve as a gate insulating film upper layer, a source electrode 5 and a drain electrode 6 which are respectively formed so as to be electrically connected to the aluminum gallium nitride (AlGaN) layer 2 to serve as first and second main electrodes, and a gate electrode 7 which is formed on the aluminum oxide ($Al_2O_3$) film 4 to serve as a control electrode, an insulating film 8 which is formed so as to cover the gate electrode 7, and a field plate electrode 9 which is formed on the insulating film 8 so as to cover the gate electrode 7 and is electrically connected to the source electrode 5.

As described above, the nitride semiconductor device according to the second embodiment of the invention has such a construction that the field plate electrode 9 which is formed so as to cover the gate electrode 7 via the insulating film 8 and is electrically connected to the source electrode 5 is added to the nitride semiconductor device according to the first embodiment of the invention.

In a construction where the field plate electrode 9 is not provided like the nitride semiconductor device according to the first embodiment of the invention shown in FIG. 1, when voltage is applied to the drain electrode 6, electric field is concentrated on an end portion of the gate electrode 7. Accordingly, when excessive voltage is applied on the drain electrode 6, the device may be damaged in the worst case.

In view of the above fact, in the nitride semiconductor device according to the second embodiment of the invention, electric field acting on the end portion of the gate electrode 7 is relaxed by additionally forming the field plate electrode 9 covering the gate electrode 7 via the insulating film 8, so that improvement in breakdown voltage in a device can be achieved.

Incidentally, since the other construction of the nitride semiconductor device according to the second embodiment of the invention is completely the same as that of the nitride semiconductor device according to the first embodiment of the invention, similar advantage or effect can be obtained by forming the aluminum nitride (AlN) film 3.

Figure 3:
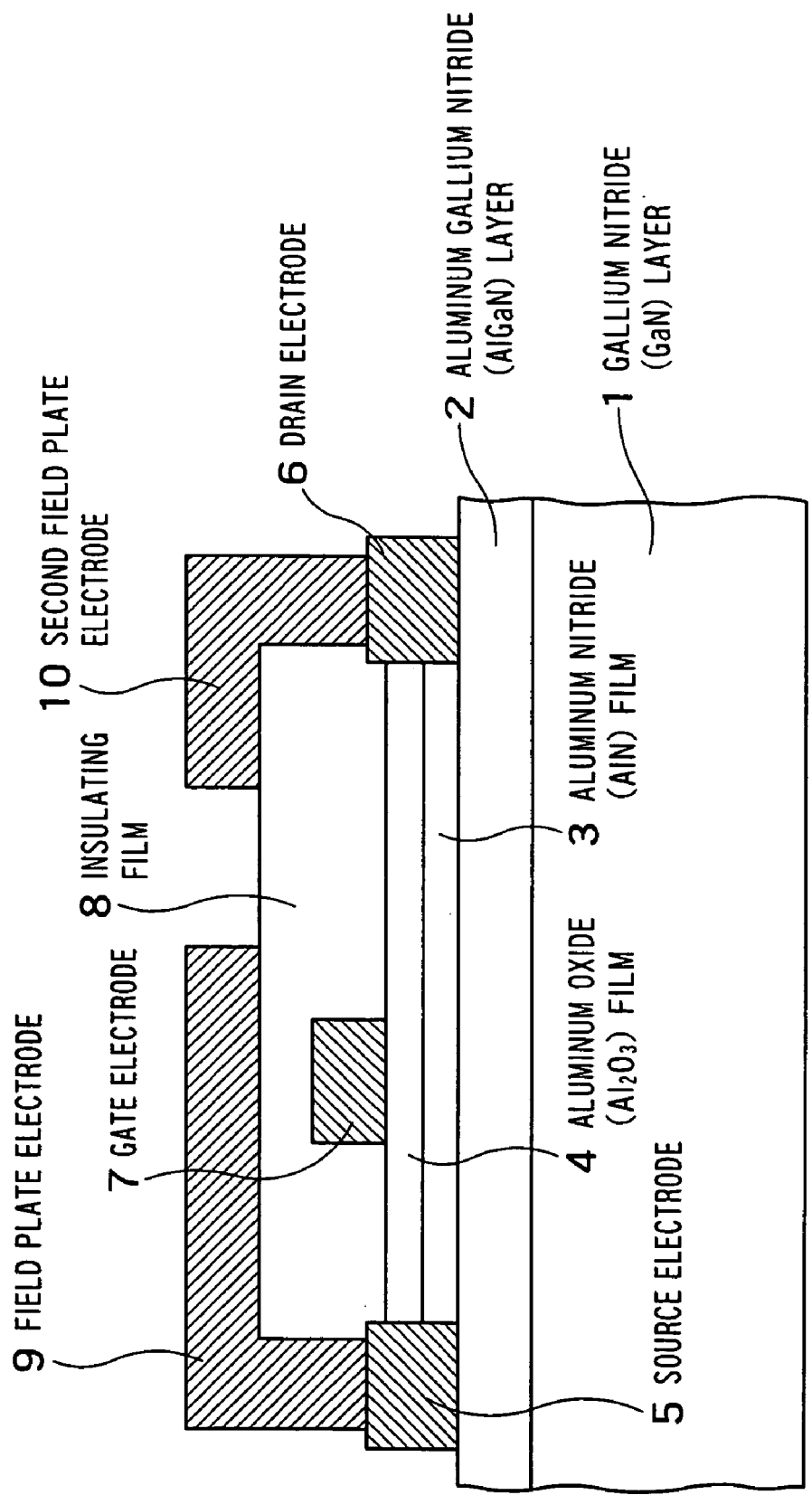
FIG. 3 is a sectional view illustratively showing a structure of a nitride semiconductor device according to a third embodiment of the invention.

FIG. 3 is a sectional view illustratively showing a structure of a nitride semiconductor device according to a third embodiment of the invention.

A nitride semiconductor device according to the third embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, an aluminum nitride (AlN) film 3 which is formed on the aluminum gallium nitride (AlGaN) layer 2 to serve as a gate insulating film lower layer, an aluminum oxide ($Al_2O_3$) film 4 which is formed on the aluminum nitride (AlN) film 3 to serve as a gate insulating film upper layer, a source electrode 5 and a drain electrode 6 which are respectively formed so as to be electrically connected to the aluminum gallium nitride (AlGaN) layer 2 to serve as first and second main electrodes, and a gate electrode 7 which is formed on the aluminum oxide ($Al_2O_3$) film 4 to serve as a control electrode, an insulating film 8 which is formed so as to cover the gate electrode 7, a field plate electrode 9 which is formed on the insulating film 8 so as to cover the gate electrode 7 and is electrically connected to the source electrode 5, and a second field plate electrode 10 which is formed on the insulating film 8 so as to cover a region in the vicinity of the drain electrode 6 between the drain electrode 6 and the gate electrode 7 and is electrically connected to the drain electrode 6.

As described above, the nitride semiconductor device according to the third embodiment of the invention has such a construction that the second field plate electrode 10 which is formed so as to cover the region in the vicinity of the drain electrode 6 between the drain electrode 6 and the gate electrode 7 via the insulating film 8 and is electrically connected to the drain electrode 6 is further added to the nitride semiconductor device according to the second embodiment of the invention.

In a construction where the second field plate electrode 10 is not provided like the nitride semiconductor devices according to the first and second embodiments of the invention shown in FIGS. 1 and 2, when voltage is applied to the drain electrode 6, electric field is concentrated on an end portion of the drain electrode 6. Accordingly, when excessive voltage is applied on the drain electrode 6, the device may be damaged in the worst case.

In view of the above fact, in the nitride semiconductor device according to the third embodiment of the invention, electric field acting on the end portion of the drain electrode 6 is relaxed by additionally forming the second field plate electrode 10 covering the region in the vicinity of the drain electrode 6 via the insulating film 8, so that improvement in breakdown voltage in a device can be achieved.

The second field plate electrode 10 may be formed directly on the aluminum oxide ($Al_2O_3$) film 4 in place of the insulating film 8.

Incidentally, since the other construction of the nitride semiconductor device according to the third embodiment of the invention is completely the same as that of the nitride semiconductor device according to the second embodiment of the invention, the electric field acting on the end portion of the gate electrode 7 is relaxed by the field plate electrode 9 so that improvement in breakdown voltage in a device is achieved, and an advantage similar to that of the nitride semiconductor devices according to the first and second embodiments of the invention can be obtained by forming the aluminum nitride (AlN) film 3.

Figure 4:
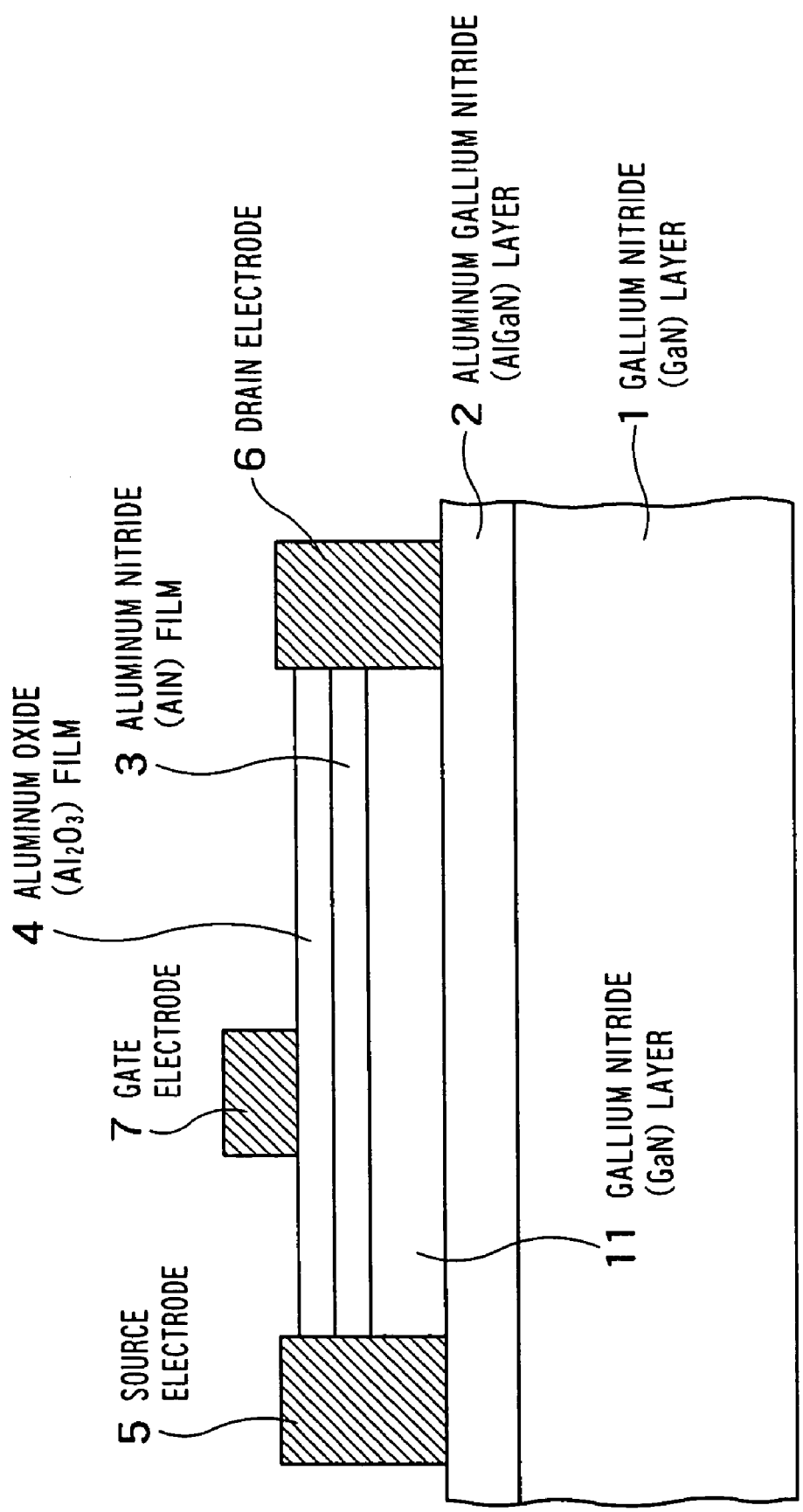
FIG. 4 is a sectional view illustratively showing a structure of a nitride semiconductor device according to a fourth embodiment of the invention.

FIG. 4 is a sectional view illustratively showing a structure of a nitride semiconductor device according to a fourth embodiment of the invention.

A nitride semiconductor device according to the fourth embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, a second gallium nitride (GaN) layer 11 which is formed on the aluminum gallium nitride (AlGaN) layer 2, an aluminum nitride (AlN) film 3 which is formed on the second gallium nitride (GaN) layer 11 to serve as a gate insulating film lower layer, an aluminum oxide ($Al_2O_3$) film 4 which is formed on the aluminum nitride (AlN) film 3 to serve as a gate insulating film upper layer, a source electrode 5 and a drain electrode 6 which are respectively formed so as to be electrically connected to the aluminum gallium nitride (AlGaN) layer 2 to serve as first and second main electrodes, and a gate electrode 7 which is formed on the aluminum oxide ($Al_2O_3$) film 4 to serve as a control electrode.

As described above, the nitride semiconductor device according to the fourth embodiment of the invention has such a construction that the second gallium nitride (GaN) layer 11 which is formed so as to be sandwiched between the aluminum gallium nitride (AlGaN) film 2 serving as a semiconductor layer and the aluminum nitride (AlN) film 3 serving as the gate insulating film is added to the nitride semiconductor device according to the first embodiment of the invention.

In the nitride semiconductor device according to the fourth embodiment of the invention, by forming the uppermost layer of the semiconductor layers just below the gate insulating film with the second gallium nitride (GaN) layer 11 instead of the aluminum gallium nitride (AlGaN) layer 2, oxidation of a surface of the semiconductor layer just below the gate insulating film is suppressed so that an excellent interface can be obtained between the gate insulating film and the semiconductor layer.

That is, since the second gallium nitride (GaN) layer 11 does not contain aluminum, natural oxidation hardly suppresses on the second gallium nitride (GaN) layer 11 itself. Further, natural oxidation of the aluminum gallium nitride (AlGaN) layer 2 can also be prevented by covering the aluminum gallium nitride (AlGaN) layer 2 with the second gallium nitride (GaN) layer 11. Accordingly, an excellent interface can be obtained between the gate insulating film and the semiconductor layer.

Figure 5:
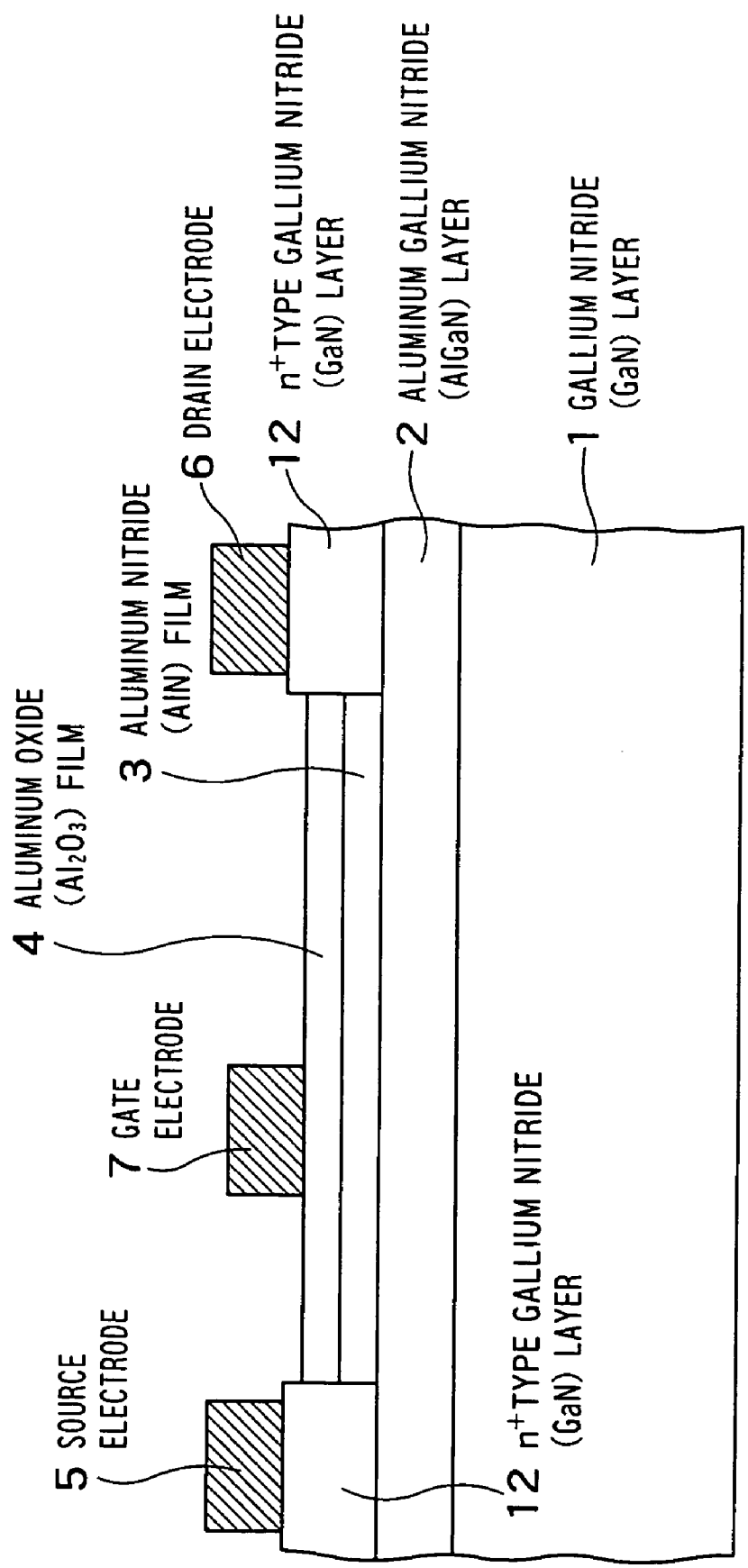
FIG. 5 is a sectional view illustratively showing a structure of a nitride semiconductor device according to a fifth embodiment of the invention.

FIG. 5 is a sectional view illustratively showing a structure of a nitride semiconductor device according to a fifth embodiment of the invention.

A nitride semiconductor device according to the fifth embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, an aluminum nitride (AlN) film 3 which is formed on the aluminum gallium nitride (AlGaN) layer 2 to serve as a gate insulating film lower layer, an aluminum oxide ($Al_2O_3$) film 4 which is formed on the aluminum nitride (AlN) film 3 to serve as a gate insulating film upper layer, $n^+$type gallium nitride (GaN) layers 12 which are formed on at least two portions on the aluminum gallium nitride (AlGaN) layer 2 so as to be separated from each other, a source electrode 5 and a drain electrode 6 which are formed so as to be electrically connected to the two separated $n^+$ type gallium nitride (GaN) layers 12 respectively and serve as first and second main electrodes, and a gate electrode 7 which is formed on the aluminum oxide ($Al_2O_3$) film 4 to serve as a control electrode.

As described above, the nitride semiconductor device according to the fifth embodiment of the invention has such a construction that the $n^+$ type gallium nitride (GaN) layers 12 which are respectively formed so as to be sandwiched between the source electrode 5 and the aluminum gallium nitride (AlGaN) layer 2 and between the drain electrode 6 and the aluminum gallium nitride (AlGaN) layer 2 are added to the nitride semiconductor device according to the first embodiment of the invention.

By forming a semiconductor layer doped with impurities, namely, the $n^+$ type gallium nitride (GaN) layers 12 between the source electrode 5 and the aluminum gallium nitride (AlGaN) layer 2 and between the drain electrode 6 and the aluminum gallium nitride (AlGaN) layer 2 in advance, contact resistances of ohmic contacts between the source electrode 5 and the aluminum gallium nitride (AlGaN) layer 2 and between the drain electrode 6 and the aluminum gallium nitride (AlGaN) layer 2 can be reduced.

Incidentally, since the other construction of the nitride semiconductor device according to the fifth embodiment of the invention is completely the same as that of the nitride semiconductor device according to the first embodiment of the invention, similar advantage can be obtained by forming the aluminum nitride (AlN) film 3.

Figure 6:
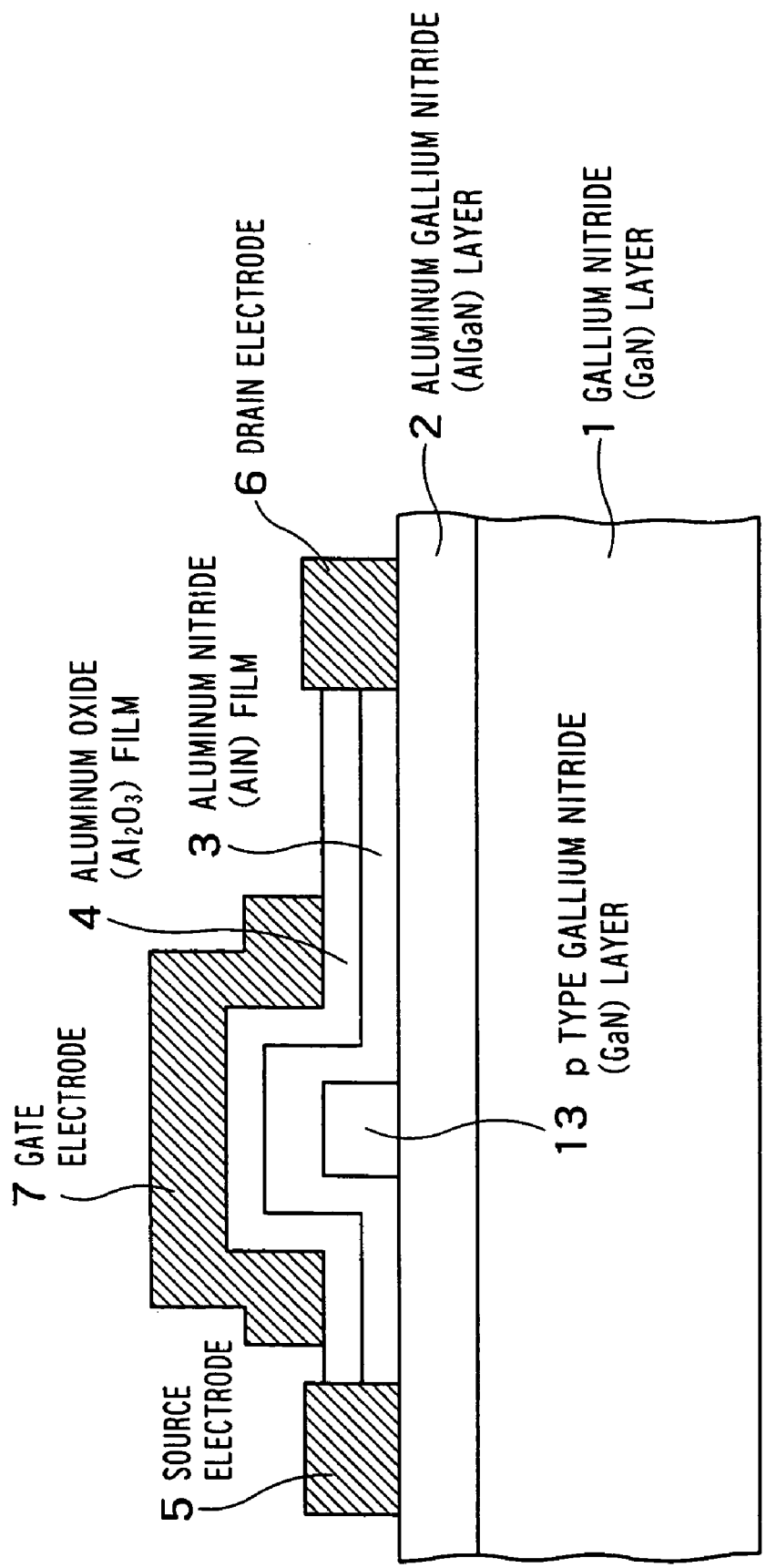
FIG. 6 is a sectional view illustratively showing a structure of a nitride semiconductor device according to a sixth embodiment of the invention.

FIG. 6 is a sectional view illustratively showing a structure of a nitride semiconductor device according to a sixth embodiment of the invention.

A nitride semiconductor device according to the sixth embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, a p type gallium nitride (GaN) layer 13 which is formed on a portion on the aluminum gallium nitride (AlGaN) layer 2, an aluminum nitride (AlN) film 3 which is formed on the aluminum gallium nitride (AlGaN) layer 2 so as to cover the p type gallium nitride (GaN) layer 13 and serves as a gate insulating film lower layer, an aluminum oxide ($Al_2O_3$) film 4 which is formed on the aluminum nitride (AlN) film 3 to serve as a gate insulating film upper layer, a source electrode 5 and a drain electrode 6 which are respectively formed so as to be electrically connected to the aluminum gallium nitride (AlGaN) layer 2 to serve as first and second main electrodes, and a gate electrode 7 which is formed on the aluminum oxide ($Al_2O_3$) film 4 on a region on which the p type gallium nitride (GaN) layer 13 is formed and serves as a control electrode.

As described above, the nitride semiconductor device according to the sixth embodiment of the invention has such a construction that the p type gallium nitride (GaN) layer 13 which is formed so as to be sandwiched between the aluminum gallium nitride (AlGaN) layer 2 and the aluminum nitride (AlN) film 3 positioned below the gate electrode 7 is added to the nitride semiconductor device according to the first embodiment of the invention.

By forming a semiconductor layer doped with impurities, namely, the p type gallium nitride (GaN) layer 13 between the aluminum gallium nitride (AlGaN) layer 2 and the aluminum nitride (AlN) film 3 positioned below the gate electrode 7 in advance, a channel positioned below the gate electrode 7 is depleted, so that a normally-off type device can be realized.

Incidentally, since the other construction of the nitride semiconductor device according to the sixth embodiment of the invention is completely the same as that of the nitride semiconductor device according to the first embodiment of the invention, similar advantage can be obtained by forming the aluminum nitride (AlN) film 3.

Figure 7:
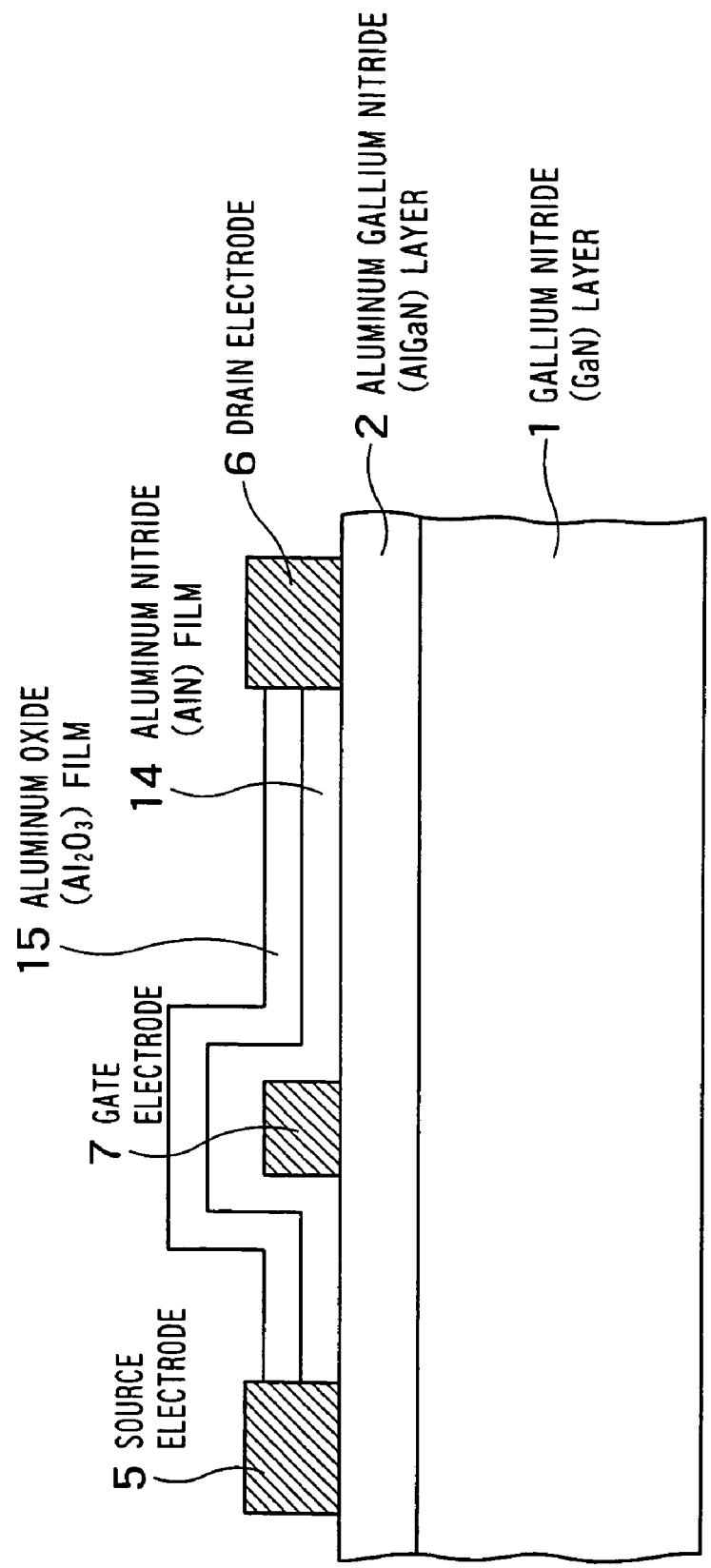
FIG. 7 is a sectional view illustratively showing a structure of a nitride semiconductor device according to a seventh embodiment of the invention.

FIG. 7 is a sectional view illustratively showing a structure of a nitride semiconductor device according to a seventh embodiment of the invention.

A nitride semiconductor device according to the seventh embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, a gate electrode 7 which is formed on a portion on the aluminum gallium nitride (AlGaN) layer 2 to serve as a control electrode, an aluminum nitride (AlN) film 14 which is formed on the aluminum gallium nitride (AlGaN) layer 2 so as to cover the gate electrode 7 to serve as a gate insulating film lower layer, an aluminum oxide ($Al_2O_3$) film 15 which is formed on the aluminum nitride (AlN) film 14 to serve as a gate insulating film upper layer, and a source electrode 5 and a drain electrode 6 which are respectively formed so as to be electrically connected to the aluminum gallium nitride (AlGaN) layer 2 to serve as first and second main electrodes.

The nitride semiconductor device according to the first embodiment of the invention shown in FIG. 1 has the MIS gate structure where the gate electrode 7 is formed on the gate insulating film, but the nitride semiconductor device according to the seventh embodiment of the invention shown in FIG. 7 has a Schottky junction gate structure where the gate electrode 7 is directly formed on the semiconductor layer.

Even when a semiconductor device has the Schottky junction gate structure, by forming the aluminum nitride (AlN) film 14 as an insulating film lower layer which is a passivation film covering the aluminum gallium nitride (AlGaN) layer 2 which is the uppermost layer of the semiconductor layers, oxidation of the aluminum gallium nitride (AlGaN) layer 2 is suppressed so that an excellent interface can be formed between the passivation film and the semiconductor layer. As a result, a Schottky junction gate structure with a high reliability can be realized without generating a new interface state even if passing through a thermal treatment process under a high temperature.

By forming the aluminum oxide ($Al_2O_3$) film 15 as the insulating film upper layer to cover the aluminum nitride (AlN) film 14, deterioration due to oxidation of the aluminum nitride (AlN) film 14 and the aluminum gallium nitride (AlGaN) layer 2 or the like can be prevented.

Figure 8:
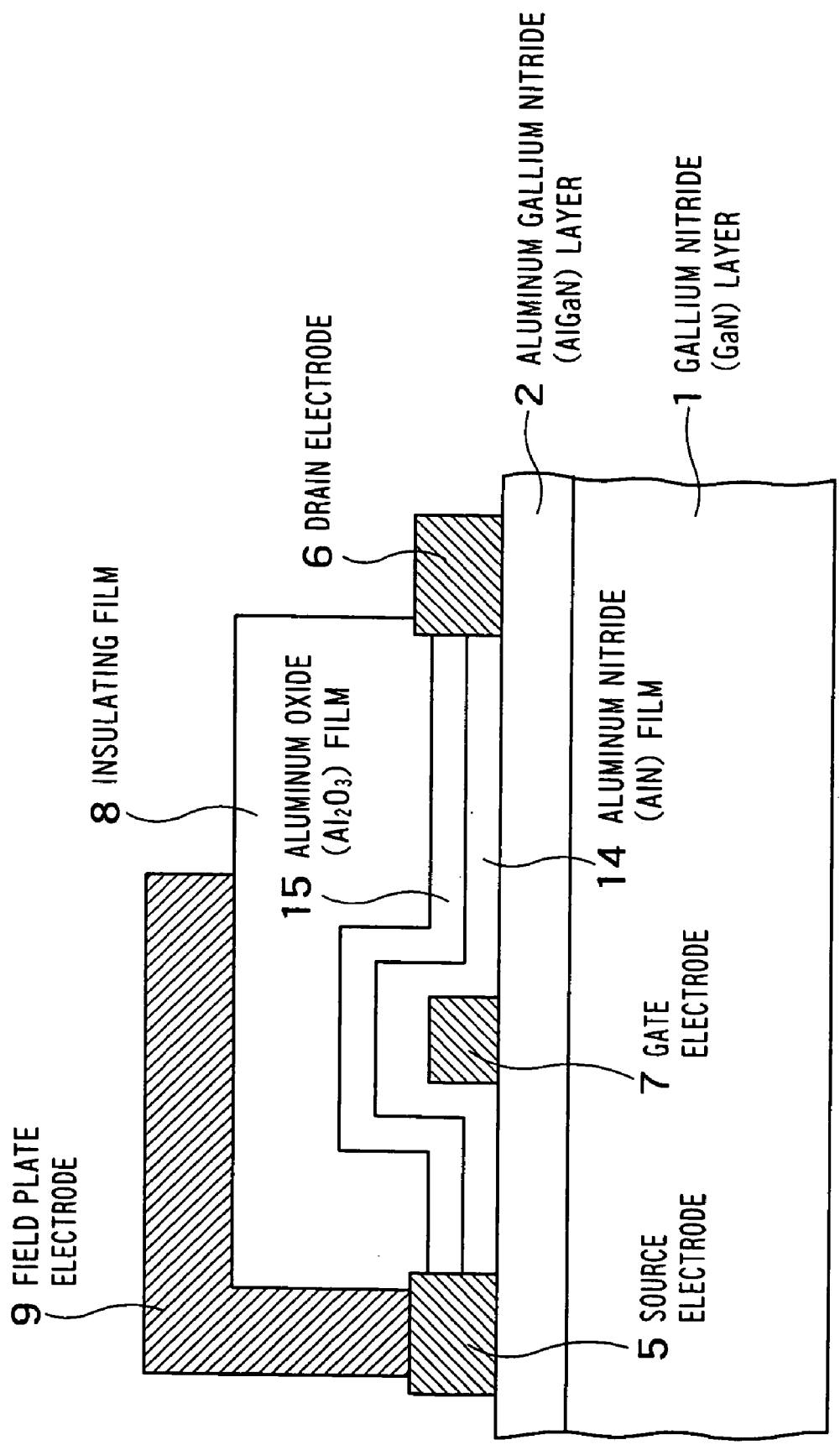
FIG. 8 is a sectional view illustratively showing a structure of a nitride semiconductor device according to a eighth embodiment of the invention.

FIG. 8 is a sectional view illustratively showing a structure of a nitride semiconductor device according to a eighth embodiment of the invention.

A nitride semiconductor device according to the eighth embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, a gate electrode 7 which is formed on a portion on the aluminum gallium nitride (AlGaN) layer 2 to serve as a control electrode, an aluminum nitride (AlN) film 14 which is formed on the aluminum gallium nitride (AlGaN) layer 2 so as to cover the gate electrode 7 to serve as a gate insulating film lower layer, an aluminum oxide ($Al_2O_3$) film 15 which is formed on the aluminum nitride (AlN) film 14 to serve as a gate insulating film upper layer, a source electrode 5 and a drain electrode 6 which are respectively formed so as to be electrically connected to the aluminum gallium nitride (AlGaN) layer 2 to serve as first and second main electrodes, an insulating film 8 which is formed on the aluminum oxide ($Al_2O_3$) film 15, and a field plate electrode 9 which is formed on the insulating film 8 so as to cover the gate electrode 7 and is electrically connected to the source electrode 5.

As described above, the nitride semiconductor device according to the eighth embodiment of the invention is a semiconductor device having a Schottky junction gate structure where the gate electrode 7 is directly formed on the semiconductor layer like the nitride semiconductor device according to the seventh embodiment of the invention, but it further includes such a structure that the field plate electrode 9 which is formed so as to cover the gate electrode 7 via the insulating film 8, the aluminum oxide ($Al_2O_3$) film 15 and the aluminum nitride (AlN) film 14 and is electrically connected to the source electrode 5 is added.

The construction of the nitride semiconductor device according to the eighth embodiment of the invention where the field plate electrode 9 is added to the nitride semiconductor device according to the seventh embodiment of the invention is a modification like the nitride semiconductor device according to the second embodiment of the invention where the field plate electrode 9 is added to the nitride semiconductor device according to the first embodiment of the invention.

In the nitride semiconductor device according to the eighth embodiment of the invention, by additionally forming the field plate electrode 9 covering the gate electrode 7 via the insulating film 8, the aluminum oxide ($Al_2O_3$) film 15 and the aluminum nitride (AlN) film 14, electric field at an end portion of the gate electrode 7 is relaxed, so that a device breakdown voltage can be further improved as compared with the nitride semiconductor device according to the seventh embodiment of the invention.

Incidentally, since the other construction of the nitride semiconductor device according to the eighth embodiment of the invention is completely the same as that of the nitride semiconductor device according to the seventh embodiment of the invention, similar advantage to that in the nitride semiconductor device according to the seventh embodiment of the invention can be obtained by forming the aluminum nitride (AlN) film 14 as the insulating film lower layer which is the passivation film covering the aluminum gallium nitride (AlGaN) layer 2 which is the uppermost layer of the semiconductor layers.

Figure 9:
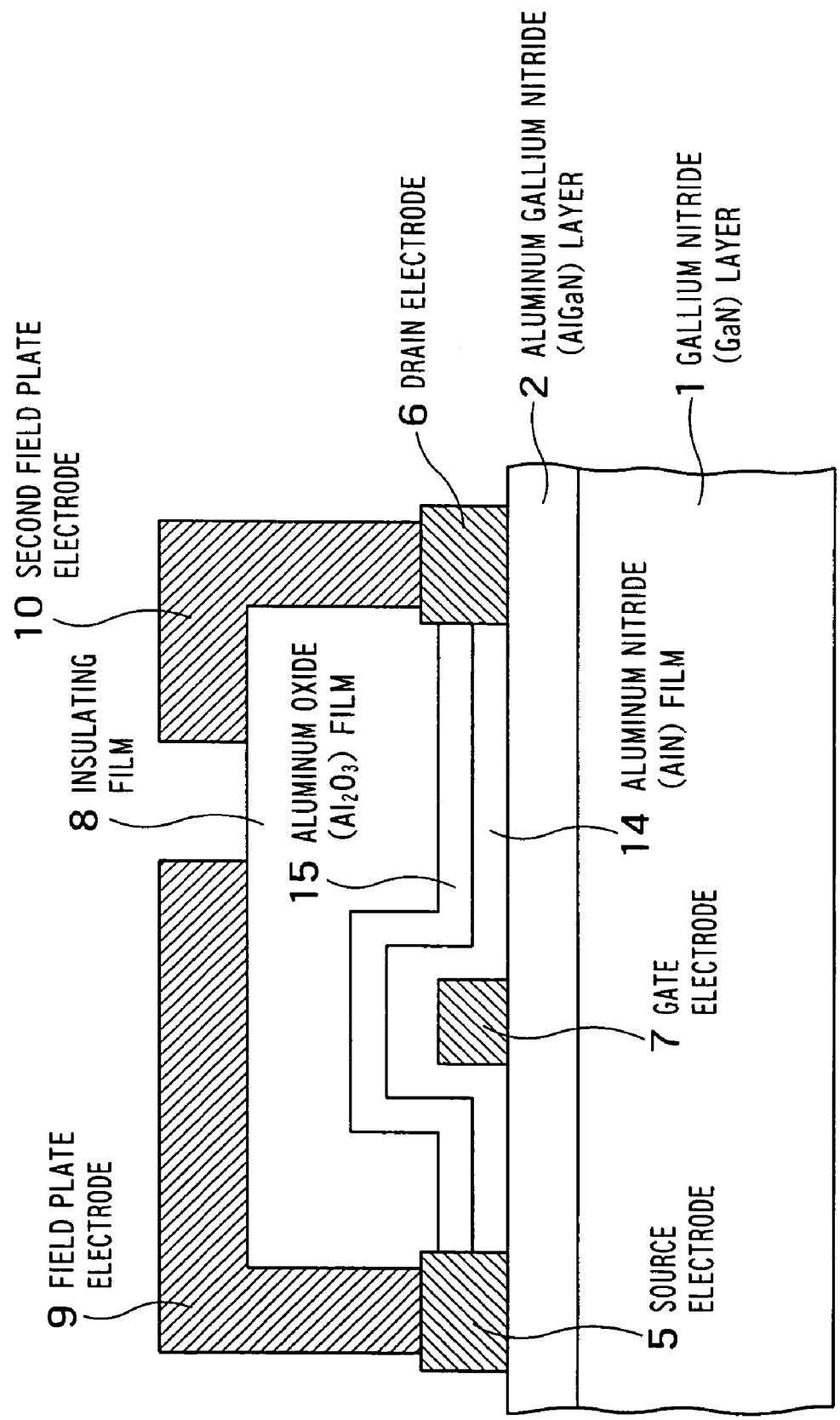
FIG. 9 is a sectional view illustratively showing a structure of a nitride semiconductor device according to a ninth embodiment of the invention.

FIG. 9 is a sectional view illustratively showing a structure of a nitride semiconductor device according to a ninth embodiment of the invention.

A nitride semiconductor device according to the ninth embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, a gate electrode 7 which is formed on a portion on the aluminum gallium nitride (AlGaN) layer 2 to serve as a control electrode, an aluminum nitride (AlN) film 14 which is formed on the aluminum gallium nitride (AlGaN) layer 2 so as to cover the gate electrode 7 to serve as a gate insulating film lower layer, an aluminum oxide ($Al_2O_3$) film 15 which is formed on the aluminum nitride (AlN) film 14 to serve as a gate insulating film upper layer, a source electrode 5 and a drain electrode 6 which are respectively formed so as to be electrically connected to the aluminum gallium nitride (AlGaN) layer 2 to serve as first and second main electrodes, an insulating film 8 which is formed on the aluminum oxide ($Al_2O_3$) film 15, a field plate electrode 9 which is formed on the insulating film 8 so as to cover the gate electrode 7 and is electrically connected to the source electrode 5, and a second field plate electrode 10 which is formed on the insulating film 8 so as to cover a region in the vicinity of the drain electrode 6 between the drain electrode 6 and the gate electrode 7 and is electrically connected to the drain electrode 6.

As described above, the nitride semiconductor device according to the ninth embodiment of the invention is a semiconductor device having a Schottky junction gate structure where the gate electrode 7 is directly formed on the semiconductor layer like the nitride semiconductor devices according to the seventh and eighth embodiments of the invention, but it further includes such a structure that the second field plate electrode 10 which is formed so as to cover the region in the vicinity of the drain electrode 6 between the drain electrode 6 and the gate electrode 7 via the insulating film 8, the aluminum oxide ($Al_2O_3$) film 15 and the aluminum nitride (AlN) film 14 and is electrically connected to the drain electrode 6 is added to the nitride semiconductor device according to the eighth embodiment of the invention.

The construction of the nitride semiconductor device according to the ninth embodiment of the invention where the second field plate electrode 10 is added to the nitride semiconductor device according to the eighth embodiment of the invention is a modification like the nitride semiconductor device according to the third embodiment of the invention where the second field plate electrode 10 is added to the nitride semiconductor device according to the second embodiment of the invention.

In the nitride semiconductor device according to the ninth embodiment of the invention, by additionally forming the second field plate electrode 10 covering the region in the vicinity of the drain electrode 6 via the insulating film 8, the aluminum oxide ($Al_2O_3$) film 15 and the aluminum nitride (AlN) film 14, electric field at an end portion of the drain electrode 6 is relaxed, so that a device breakdown voltage can be further improved as compared with that of the nitride semiconductor device according to the eighth embodiment of the invention.

The second field plate electrode 10 may be directly formed on the aluminum oxide ($Al_2O_3$) film 15 but not on the insulating film 8.

Incidentally, since the other construction of the nitride semiconductor device according to the ninth embodiment of the invention is completely the same as that of the nitride semiconductor device according to the eighth embodiment of the invention, an advantage similar to that in the nitride semiconductor devices according to the seventh and eighth embodiments of the invention can be obtained by forming the aluminum nitride (AlN) film 14 as the insulating film lower layer which is the passivation film covering the aluminum gallium nitride (AlGaN) layer 2 which is the uppermost layer in the semiconductor layer.

Figure 10:
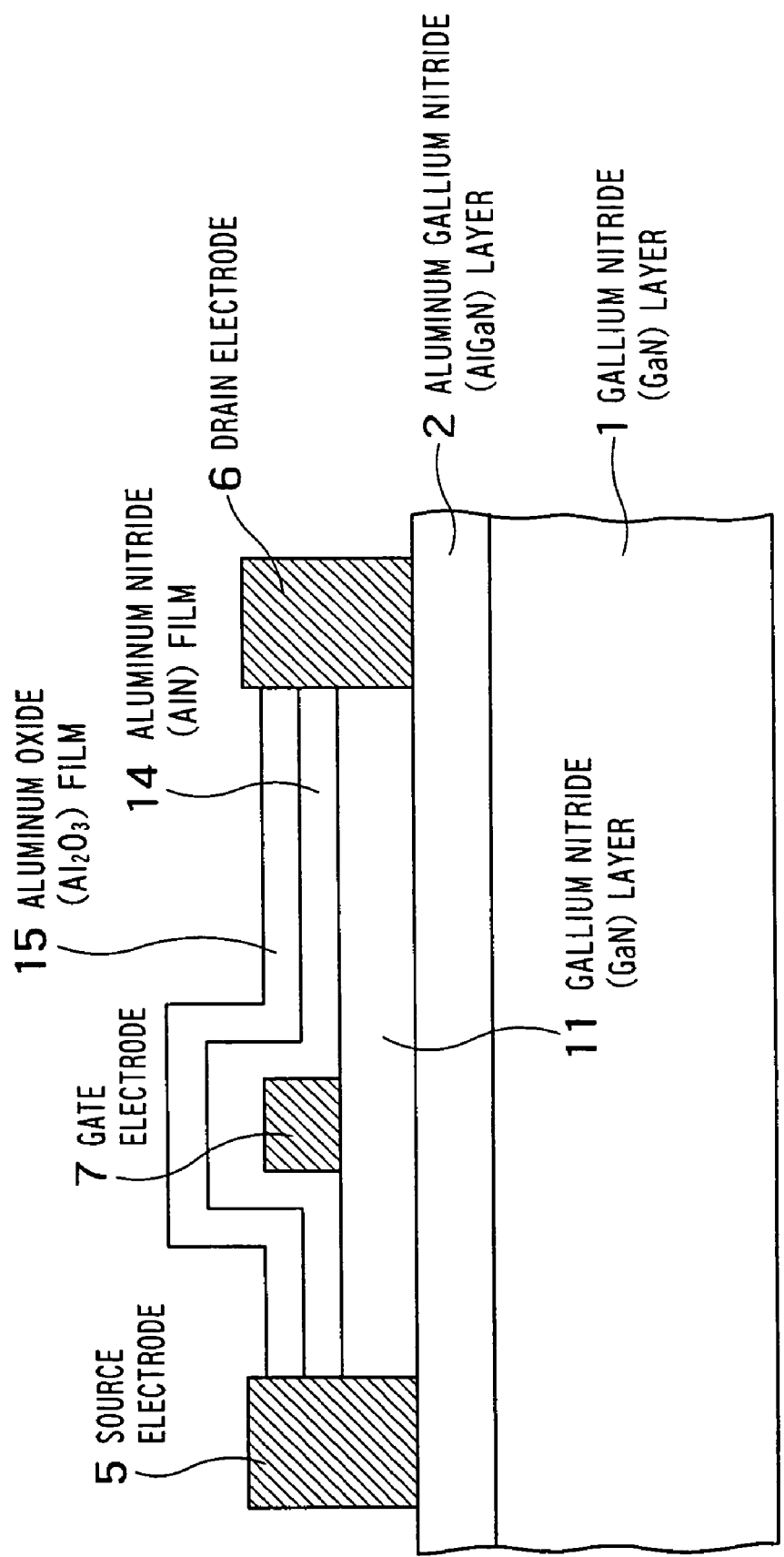
FIG. 10 is a sectional view illustratively showing a structure of a nitride semiconductor device according to a tenth embodiment of the invention.

FIG. 10 is a sectional view illustratively showing a structure of a nitride semiconductor device according to a tenth embodiment of the invention.

A nitride semiconductor device according to the tenth embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, a second gallium nitride (GaN) layer 11 which is formed on the aluminum gallium nitride (AlGaN) layer 2, a gate electrode 7 which is formed on a portion on the second gallium nitride (GaN) layer 11 to serve as a control electrode, an aluminum nitride (AlN) film 14 which is formed on the second gallium nitride (GaN) layer 11 so as to cover the gate electrode 7 to serve as a gate insulating film lower layer, an aluminum oxide ($Al_2O_3$) film 15 which is formed on the aluminum nitride (AlN) film 14 to serve as a gate insulating film upper layer, and a source electrode 5 and a drain electrode 6 which are respectively formed so as to be electrically connected to the aluminum gallium nitride (AlGaN) layer 2 to serve as first and second main electrodes.

As described above, the nitride semiconductor device according to the tenth embodiment of the invention has such a construction that the second gallium nitride (GaN) layer 11 which is formed so as to be sandwiched between the aluminum gallium nitride (AlGaN) layer 2 serving as the semiconductor layer and the aluminum nitride (AlN) film 14 serving as the passivation film is added to the nitride semiconductor device according to the seventh embodiment of the invention.

In the nitride semiconductor device according to the tenth embodiment of the invention, by forming the second gallium nitride (GaN) layer 11 as the uppermost layer of the semiconductor layers just below the passivation film instead of the aluminum gallium nitride (AlGaN) layer 2, oxidation of a surface of the semiconductor layer just below the passivation film is suppressed so that an excellent interface can be obtained between the passivation film and the semiconductor layer like the nitride semiconductor device according to the fourth embodiment of the invention.

Figure 11:
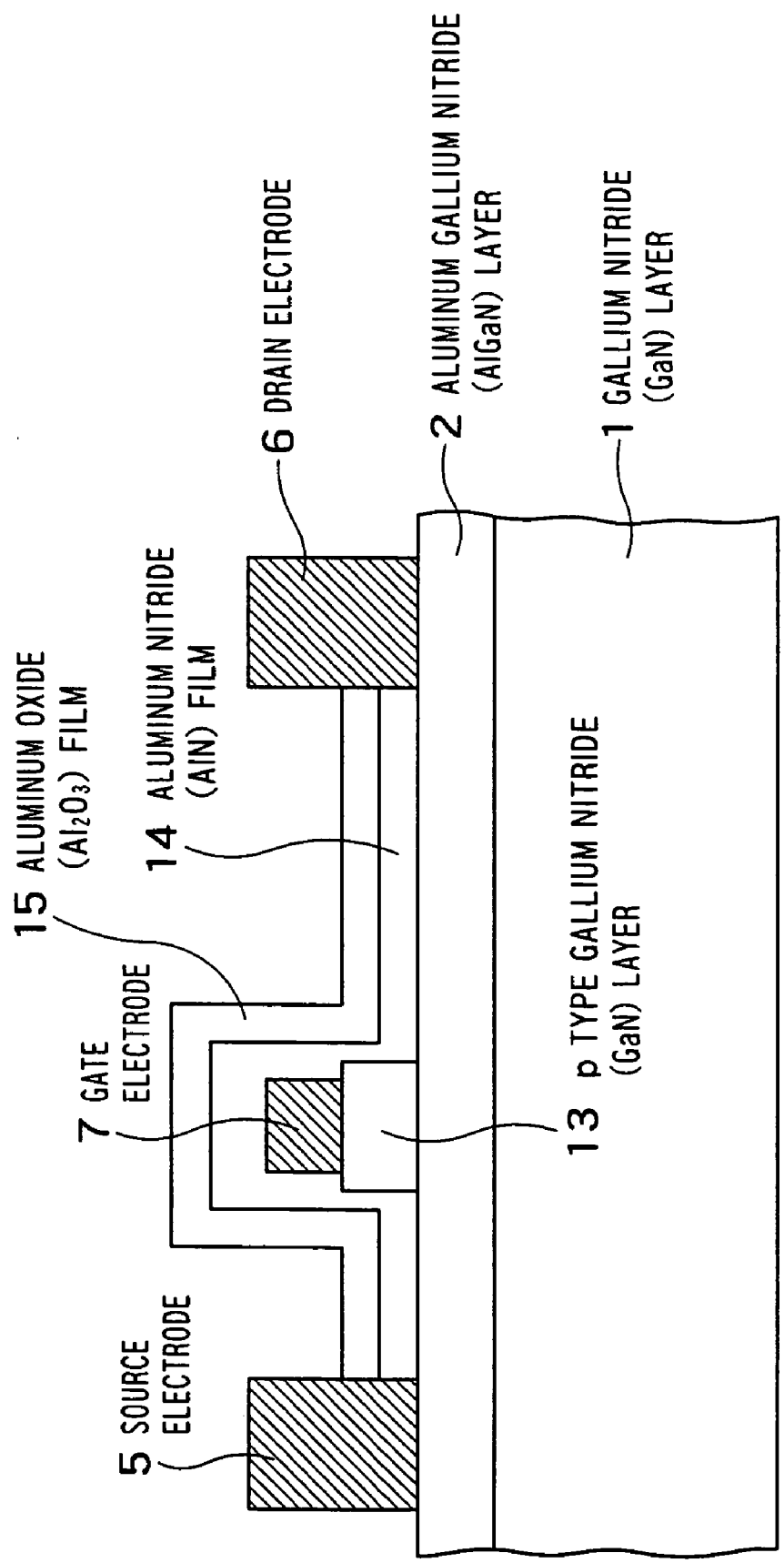
FIG. 11 is a sectional view illustratively showing a structure of a nitride semiconductor device according to a eleventh embodiment of the invention.

FIG. 11 is a sectional view illustratively showing a structure of a nitride semiconductor device according to a eleventh embodiment of the invention.

A nitride semiconductor device according to the eleventh embodiment of the invention includes a non-doped gallium nitride (GaN) layer 1 serving as a channel layer, a non-doped aluminum gallium nitride (AlGaN) layer 2 which is formed on the gallium nitride (GaN) layer 1 to serve as a barrier layer, a p type gallium nitride (GaN) layer 13 which is formed on a portion on the aluminum gallium nitride (AlGaN) layer 2, a gate electrode 7 which is formed on the p type gallium nitride (GaN) layer 13 to serve as a control electrode, an aluminum nitride (AlN) film 14 which is formed on the aluminum gallium nitride (AlGaN) layer 2 so as to cover the gate electrode 7 and the p type gallium nitride (GaN) layer 13 to serve as a gate insulating film lower layer, an aluminum oxide ($Al_2O_3$) film 15 which is formed on the aluminum nitride (AlN) film 14 to serve as a gate insulating film upper layer, and a source electrode 5 and a drain electrode 6 which are respectively formed so as to be electrically connected to the aluminum gallium nitride (AlGaN) layer 2 to serve as first and second main electrodes.

As described above, the nitride semiconductor device according to the eleventh embodiment of the invention has such a construction that the p type gallium nitride (GaN) layer 13 which is formed so as to be sandwiched between the gate electrode 7 and the aluminum gallium nitride (AlGaN) layer 2 is added to the nitride semiconductor device according to the seventh embodiment of the invention.

By forming a semiconductor layer doped with impurities, namely, the p type gallium nitride (GaN) layer 13 between the gate electrode 7 and the aluminum gallium nitride (AlGaN) layer 2 in advance, a channel positioned below the gate electrode 7 is depleted, so that a normally-off type device can be realized like the nitride semiconductor device according to the sixth embodiment of the invention.

Incidentally, since the other construction of the nitride semiconductor device according to the eleventh embodiment of the invention is completely the same as that of the nitride semiconductor device according to the seventh embodiment of the invention, similar advantage can be obtained by forming the aluminum nitride (AlN) film 3.

Though the nitride semiconductor devices according to the first to eleventh embodiments of the invention have been explained above, the present invention is not limited to these embodiments, and the construction of the present invention can be further applied to any modification which can be made easily by those skilled in the art.

For example, in the nitride semiconductor devices according to the sixth and eleventh embodiments of the invention, a p type aluminum gallium nitride (AlGaN) layer may be formed instead of the p type gallium nitride (GaN) layer 13 realizing the normally-off type device in view of depletion of the channel.

Further, in each of the above embodiments, the semiconductor device containing the aluminum gallium nitride/gallium nitride (AlGaN/GaN) heterostructure has been explained as examples, but the construction of the present invention can also be applied to a semiconductor device including a gallium nitride/indium gallium nitride (GaN/InGaN) heterostructure or an aluminum nitride/aluminum gallium nitride (AlN/AlGaN) heterostructure.

This text does not describe substrate material forming the aluminum gallium nitride/gallium nitride (AlGaN/GaN) heterostructure specifically, but the construction of the invention is applicable to any substrate without depending on such a substrate material as a sapphire substrate, a silicone carbide (SiC) substrate or a silicone (Si) substrate and regardless of characteristics such as conductivity or insulating property of substrate material to be used.

Moreover, in each of the above embodiments, the aluminum gallium nitride (AlGaN) layer 2 has been explained utilizing the non-doped aluminum gallium nitride (AlGaN) layer, but the present invention can be implemented using an n type aluminum gallium nitride (AlGaN) layer instead thereof.

As explained above, according to the nitride semiconductor device according to one embodiment of the present invention, a nitride semiconductor device which has an excellent interface between a gate insulating film and a semiconductor layer and is provided with a stable insulating gate structure with reduced leakage current can be realized by forming the aluminum oxide/aluminum nitride ($Al_2O_3$/AlN) stacked structure as the gate insulating film.

What is claimed is:

1. A nitride semiconductor device comprising:
    a non-doped first aluminum gallium nitride ($Al_xGa_{1-x}N$ ($0 \leq x \leq 1$)) layer which is formed as a channel layer;
    a non-doped or n type second aluminum gallium nitride ($Al_yGa_{1-y}N$ ($0 \leq y \leq 1$, $x \leq y$)) layer which is formed on the first aluminum gallium nitride layer as a barrier layer;
    an aluminum nitride (AlN) film which is formed on the second aluminum gallium nitride layer as a gate insulating film lower layer, the aluminum nitride film being selected from a polycrystalline film and an amorphous film;
    an aluminum oxide ($Al_2O_3$) film which is formed on the aluminum nitride film as a gate insulating film upper layer;
    a source electrode and a drain electrode which are formed as first and second main electrodes to be electrically connected to the second aluminum gallium nitride layer, respectively; and
    a gate electrode which is formed on the aluminum oxide film as a control electrode.

2. The nitride semiconductor device according to claim 1, further comprising:
    an insulating film which is formed to cover the gate electrode; and
    a field plate electrode which is formed on the insulating film to cover the gate electrode and is electrically connected to the source electrode.

3. The nitride semiconductor device according to claim 2, further comprising:
    a second field plate electrode which is formed on the insulating film to cover a region positioned in the vicinity of the drain electrode between the drain electrode and the gate electrode and is electrically connected to the drain electrode.

4. The nitride semiconductor device according to claim 1, further comprising:
    a gallium nitride layer which is formed to be sandwiched between the second aluminum gallium nitride layer and the aluminum nitride film.

5. The nitride semiconductor device according to claim 4, wherein the gallium nitride layer is selectively formed on a region between the second aluminum gallium nitride layer and the aluminum nitride film.

6. The nitride semiconductor device according to claim 5, wherein a conductive type of the gallium nitride layer is a p type.

7. The nitride semiconductor device according to claim 1, further comprising:
    gallium nitride layers which are formed to be sandwiched between the second aluminum gallium nitride layer and the source electrode and between the second aluminum gallium nitride layer and the drain electrode.

8. The nitride semiconductor device according to claim 1, wherein the aluminum oxide film is a polycrystalline film.

9. The nitride semiconductor device according to claim 1, wherein the aluminum oxide film is an amorphous film.

10. A nitride semiconductor device comprising:
    a non-doped first aluminum gallium nitride ($Al_xGa_{1-x}N$ ($0 \leq x \leq 1$)) layer which is formed as a channel layer;
    a non-doped or n type second aluminum gallium nitride ($Al_yGa_{1-y}N$ ($0 \leq y \leq 1$, $x < y$)) layer which is formed on the first aluminum gallium nitride layer as a barrier layer;
    a gate electrode which is formed on a portion of the second aluminum gallium nitride layer as a control electrode;
    an aluminum nitride (AlN) film which is formed on the second aluminum gallium nitride layer to cover the gate electrode as an insulating film lower layer, the aluminum nitride film being selected from a polycrystalline film and an amorphous film;
    an aluminum oxide ($Al_2O_3$) film which is formed on the aluminum nitride film as an insulating film upper layer; and
    a source electrode and a drain electrode which are formed as first and second main electrodes to be electrically connected to the second aluminum gallium nitride layer, respectively.

11. The nitride semiconductor device according to claim 10, further comprising:
    an insulating film which is formed on the aluminum oxide film; and
    a field plate electrode which is formed on the insulating film to cover the gate electrode and is electrically connected to the source electrode.

12. The nitride semiconductor device according to claim 11, further comprising:
    a second field plate electrode which is formed on the insulating film to cover a region positioned in the vicinity of the drain electrode between the drain electrode and the gate electrode and is electrically connected to the drain electrode.

13. The nitride semiconductor device according to claim 10, further comprising:
    a gallium nitride layer which is formed to be sandwiched between the second aluminum gallium nitride layer and the gate electrode.

14. The nitride semiconductor device according to claim 13, wherein a conductive type of the gallium nitride layer is a p type.

15. The nitride semiconductor device according to claim 10, wherein the aluminum oxide film is a polycrystalline film.

16. The nitride semiconductor device according to claim 10, wherein the aluminum oxide film is an amorphous film.

* * * * *